United States Patent
Lesenco et al.

(10) Patent No.: US 10,566,409 B2
(45) Date of Patent: Feb. 18, 2020

(54) INTEGRATED QUANTIZED INDUCTOR AND FABRICATION METHOD THEREOF

(71) Applicants: Dumitru Nicolae Lesenco, Austin, TX (US); Nicolae Dumitru Lesenco, Austin, TX (US)

(72) Inventors: Dumitru Nicolae Lesenco, Austin, TX (US); Nicolae Dumitru Lesenco, Austin, TX (US)

(*) Notice: Subject to any disclaimer, the term of this patent is extended or adjusted under 35 U.S.C. 154(b) by 0 days.

(21) Appl. No.: 15/150,443

(22) Filed: May 10, 2016

(65) Prior Publication Data

US 2016/0284651 A1 Sep. 29, 2016

(51) Int. Cl.
| | |
|---|---|
| H01F 17/04 | (2006.01) |
| H01L 49/02 | (2006.01) |
| H01L 23/522 | (2006.01) |
| H03F 3/195 | (2006.01) |
| H01F 17/00 | (2006.01) |
| H01F 27/28 | (2006.01) |
| H03F 1/22 | (2006.01) |

(52) U.S. Cl.
CPC ......... *H01L 28/10* (2013.01); *H01F 17/0033* (2013.01); *H01F 27/2804* (2013.01); *H01L 23/5225* (2013.01); *H01L 23/5227* (2013.01); *H03F 1/223* (2013.01); *H03F 3/195* (2013.01); *H01F 2017/008* (2013.01); *H01F 2027/2809* (2013.01); *H03F 2200/451* (2013.01)

(58) Field of Classification Search
CPC ......................... H01F 17/0033; H01L 23/5225
See application file for complete search history.

(56) References Cited

U.S. PATENT DOCUMENTS

| | | | | | |
|---|---|---|---|---|---|
| 5,349,743 | A | * | 9/1994 | Grader ................ | H01F 17/0033 156/89.12 |
| 5,548,265 | A | * | 8/1996 | Saito ................... | H01F 17/0006 336/200 |
| 5,877,667 | A | * | 3/1999 | Wollesen ............ | H01F 17/0033 336/181 |
| 6,611,041 | B2 | * | 8/2003 | Maeda ............... | H01L 21/28518 257/347 |
| 2001/0041401 | A1 | * | 11/2001 | Ahn ..................... | H01F 17/0013 438/238 |
| 2015/0333019 | A1 | * | 11/2015 | Lee ..................... | H01L 23/66 257/508 |

\* cited by examiner

*Primary Examiner* — Charlie Y Peng

(57) ABSTRACT

An integrated, quantized inductor, comprising a plurality of identical inductor sections, is provided for multiple applications on the chip. The inductor section represents one turn and includes two stacked metal layers with identical area and configuration, separated by dielectric layers, winding around the insulated ferromagnetic core, and interconnected by via. Power transformer, having a primary winding and multiple secondary windings comprised of a plurality of identical inductor sections and a shielded common ferromagnetic core ring, placed outside of the active chip area between the seal ring and pad-ring enhanced area. Inside of active chip area, in proximity to the related linear RF components are placed sensitive inductors, balun-transformers, resonator, separately protected by EM guard rings, wherein one node is open, and the second one is tied to the ground. The fabrication is compatible with integrated circuits manufacturing.

8 Claims, 8 Drawing Sheets

INTEGRATED QUANTIZED INDUCTOR AND FABRICATION METHOD THEREOF

BACKGROUND OF THE INVENTION

1. Field of the Invention

This invention relates to Radio Frequency Integrated Circuit (RFIC) devices and more particularly to on-chip inductors, transformers, resonators and electromagnetic guard rings as well as other applications such as mixed signal integrated circuits (MSIC), systems on the chip (SOC), and microelectromechanical systems (MEMS).

There have been various attempts shown in the prior art to construct workable chip type transformers, inductors and resonators. One such attempt is shown in U.S. Pat. No. 5,497,137 entitled "Chip type transformer" issued to Yasuhiro Fujiki, Japan in which a balanced-unbalanced (balun) type transformer is constructed as a chip type transformer in which there is a laminate having five dielectric substrates superimposed on one another. A ground connection is formed on one main surface of the dielectric substrate and a ground connection is formed on the main surface of the dielectric substrate. A connecting electrode is formed on one main surface of the second dielectric substrate and a strip line is formed on one main surface of the third dielectric substrate. The strip line consists of a spiral portion and a second spiral portion. A second spiral strip line and a third spiral strip line are formed on one main surface of the fourth dielectric substrate and the second strip line and the third strip line are electromagnetically connected with the portion of the strip line and the second portion respectively.

The U.S. Pat. No. 5,075,641 entitled "High frequency oscillator comprising co-integrated thin film resonator and active device" issued to Robert J. Weber et al from Iowa State University, described a co-integrated high frequency oscillator including a thin film resonator and active devices formed on the same semiconductor substrate and by a process which is compatible with formation of both the thin film resonator and the active devices. The processes utilized in formation of the thin film resonator are adapted to microelectronic processing techniques such that the steps of formation of the active devices and the thin film resonator can be intermixed to the degree necessary to allow the metallization layers to serve as elements of both the active devices and the thin film resonator.

Another such attempt is disclosed in U.S. Pat. No. 5,877,667 entitled "On-chip transformers" invented by Donald I. Willesden issued to AMD (CA) in which various embodiments of on chip-transformers constructed in separate metal layers in an insulator that serves as a dielectric which is formed on a substrate such as a silicon substrate. Windings with currents flowing in a first direction are constructed in a first metal layer and windings with currents flowing a second direction are constructed in a second metal layer. Windings in the first metal layer are connected to windings in the second metal layer by connectors such as via. The transformer can be constructed in a balun layout, an autotransformer layout, a layout with the secondary separated from the primary, a layout with the secondary separated the primary and rotated with respect to an axis of the primary, a layout in which the transformer is a two stage transformer and with the first stage constructed orthogonal to the second stage, or a transformer in which the windings are constructed in a toroidal layout.

In general, when designing an RFIC layout there are many challenges. High among those challenges is ensuring that the inductors work as expected. In addition to making sure that they have the right L and Q values. Isolation is a major consideration. Inductors take up a lot of room relative to active devices, especially at advanced nodes. Floor planning is a critical step. The performance of the entire design hinges on the inductor physical design. It is crucial to have the ability to look at circuit level effects, to adjust the geometric configuration of layers after extraction net list from the layout view and simulation. Many designers today simply rely on Process Design Kits (PDK) devices and models, but more is needed for low power RFIC operating at a multi gigahertz frequency. Different floor planning has a different electromagnetic parasitic impact on inductors, transformers, resonators, active devices and low impedance tracks.

2. Summary of the Invention

In accordance with the present invention on-chip quantized inductor has a plurality of inductor sections and shielded ferromagnetic core, wherein each inductor section represents one turn and includes two stacked insulated metal layers with identical area and configuration, winding around the insulated ferromagnetic layer (s) and interconnected by via. Inductance of inductor depends on the number of consecutively connected inductor sections. On-chip AC power transformer having a primary winding and multiple secondary windings comprised of a common ferromagnetic shielded ring and is placed out of the active chip area between said seal ring and said pad ring enhanced area. The sensitive balanced-to-unbalanced device said balun, transformers, resonators, and inductors, composed from quantized inductors, are placed inside of the active chip area in proximity to related linear components, and are protected separately by EM guard rings. Each EM guard ring comprising a plurality of shielded quantized inductors with a common ferromagnetic core, wherein one node of each inductor is open and second one is tied to the ground and serves as an antenna. The on-chip resonator is composed of a quantized inductor having a number of inductor sections, and the same number of parallel connected capacitor sections, placed on the top of inductor sections wherein the total value of the capacitance can be adjusted during IC physical design after extraction netlist from layout view and simulation in order to achieve the bestQ-factor.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Turning now to the drawings.

Figure 1:
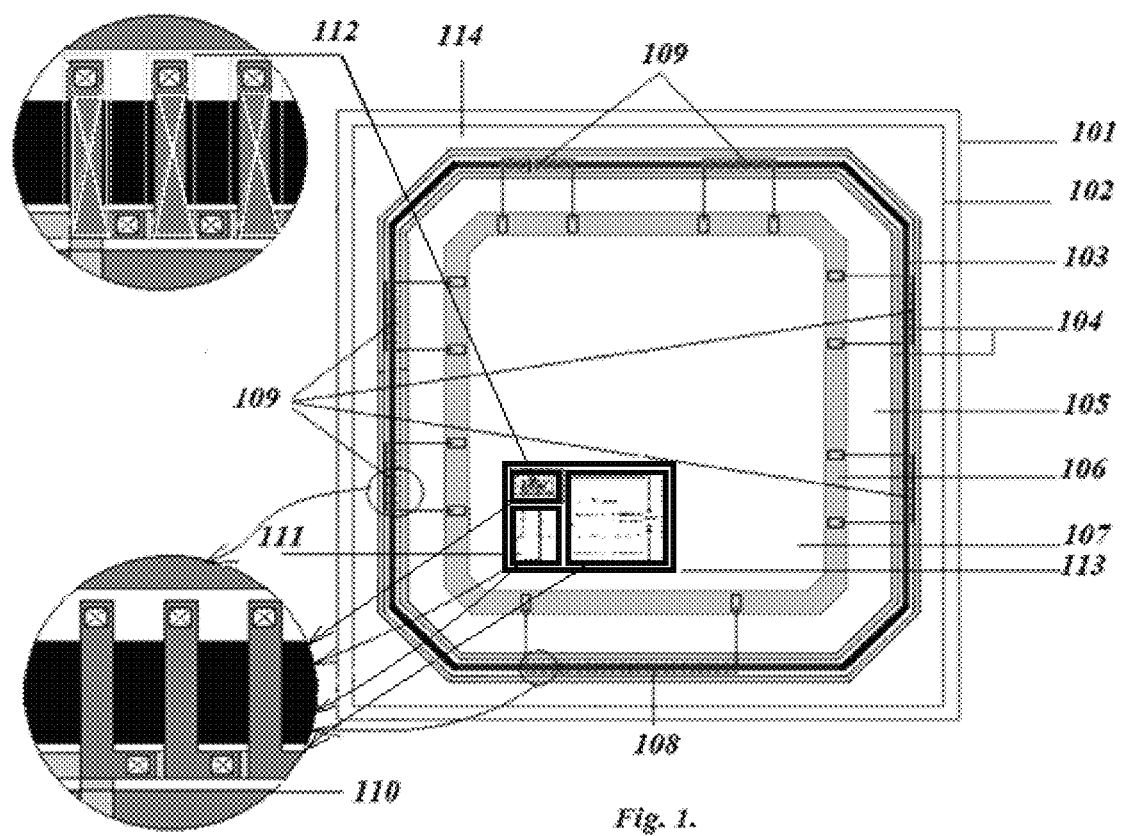
FIG. 1 illustrates the first preferred embodiment of the present invention, showing a plan view of the chip with quantized inductors, AC power transformer, placed outside of active chip aria, and balun transformer, inductors and resonators, placed inside of chip area.

FIG. 1 is a general plan view of the chip 101 with on-chip quantized AC power transformer, having a primary winding 108 and multiple secondary winding 109, a common ferromagnetic core ring 103, shielding metallic envelope 104 and placed out of active chip area 105 between seal ring 102 and pad-ring enhanced area 106. Inside of active chip area 107 proximity to related sensitive linear active components are placed differential amplifier with balun, sensitive inductors 111, LNA 113 and resonator 112, wherein inductors are protected from inside and outside electromagnetic (EM) impact by EM guard rings. All inductors in this application are composed from identical layout of inductor sections 110.

Figure 2:
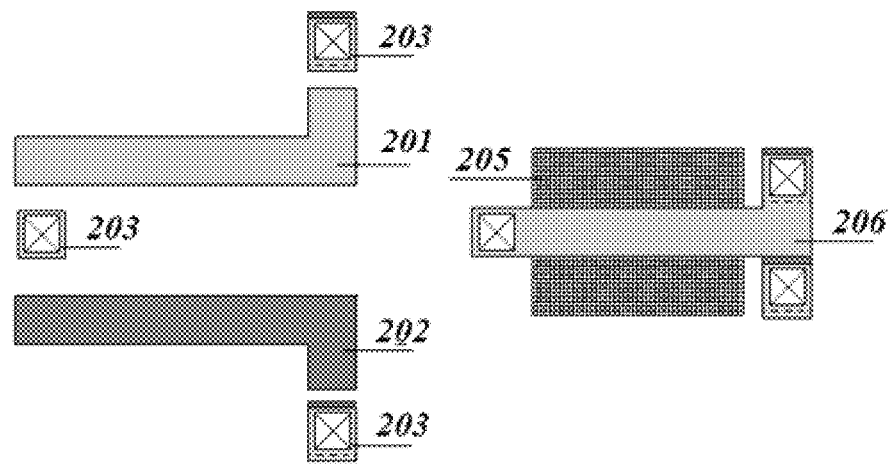
FIG. 2 illustrates the floor planning of one inductor section, composed from two identical metal layers, via and a portion of ferromagnetic core.
Figure 3:
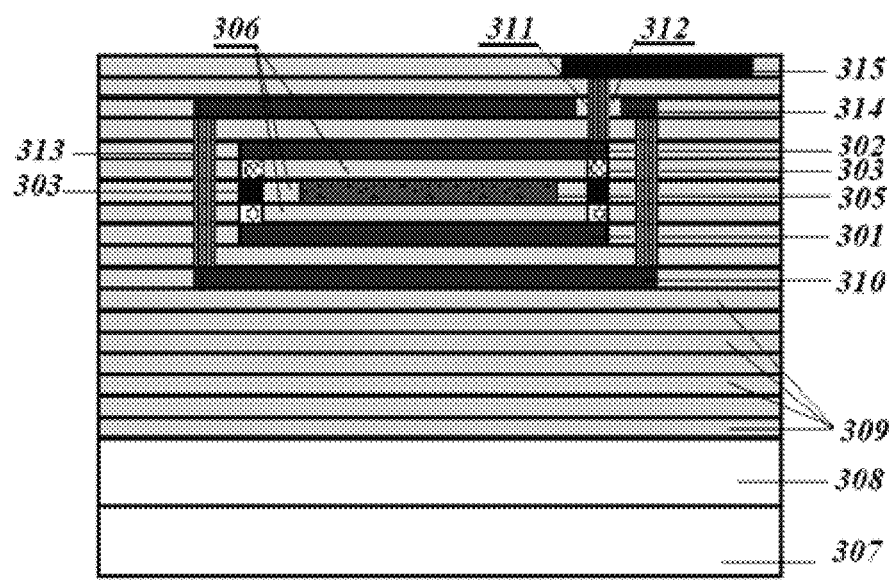
FIG. 3 illustrates the vertical cross section view of inductor section.

FIG. 2 illustrates the floor planning of one inductor section 206, composed from two identical metal layers 201 and 202, winding around of ferromagnetic core 205, and interconnected by via 203; FIG. 3 illustrates the vertical cross section view of inductor section, were ferromagnetic core 305 is insulated by $SiO_2$ or $Si_3N_4$ layers 306, shielded by bottom 310 and top 314 metal layers, interconnected by via 313. Inductor sections are composed from identical shapes of metal 301 and 302, interconnected by via 303. Input and output of inductor are implemented on top metal layer 315 interconnected by via 311 placed on respective via 303, through window 312 in metal layer 314. Inductor is fabricated using CMOS, BICMOS, BCD, FINFET or MEMS processing. In order to minimize EM impact of inductors to components 307, 308 and M1, M2, M3, M4, M5, M6, M7 routings 309 it is required to start implementation of bottom shielding metal layer 310 up to M8.

Figure 4:
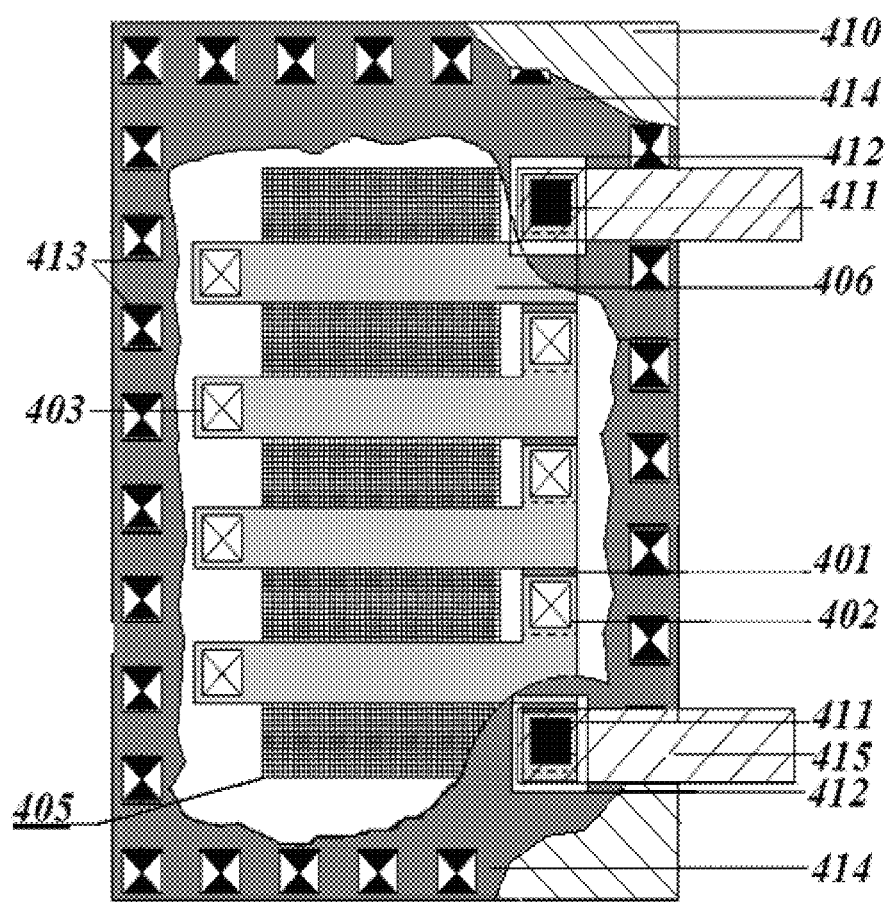
FIG. 4 illustrate the second preferred embodiment of a quantized inductor, composed from inductor sections, ferromagnetic core, metallic envelope and input-output metal connection.

FIG. 4 illustrate the second preferred embodiment of a quantized inductor, composed from inductor sections 406, each formed from two identical shapes 401 and 402, ferromagnetic core 405, via 403, shielding metal layers 410, 414, 413 and input-output metal connection 415 by via 411 on respective via 403, through window 412 in metal layer 414.

Figure 5:
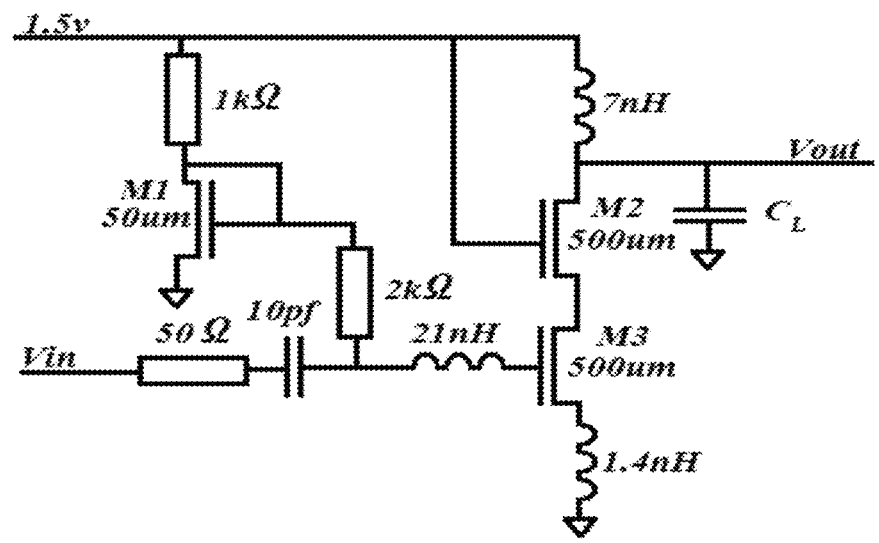
FIG. 5 illustrates the schematic of a complete 1.5 GHz, 8 mW single-ended low noise amplifier (LNA)

FIG. 5 illustrates the schematic of a complete 1.5 GHz, 8 mW single-ended low noise amplifier (LNA), as an example for physical implementation of the present invention.

Figure 6:
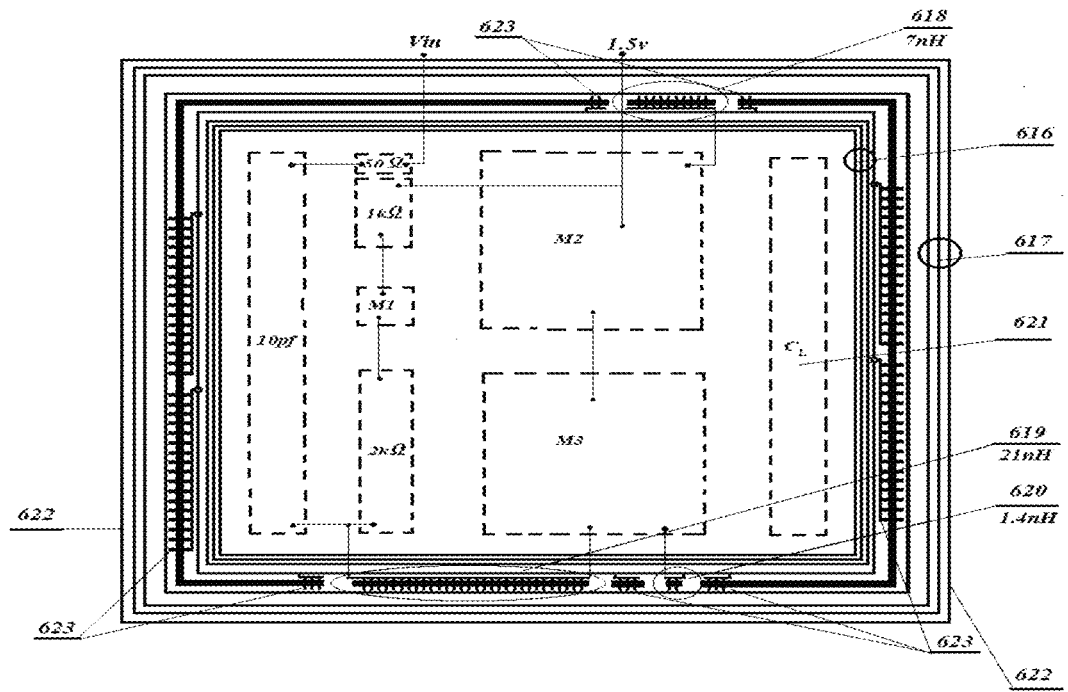
FIG. 6 illustrates the third preferred embodiment of the present invention, showing layout floor planning of a complete 1.5 GHz, 8 mW single-ended LNA with EM guard rings on the chip.

FIG. 6 illustrates the third preferred embodiment of present invention showing layout floor planning of a complete 1.5 GHz, 8 mW single-ended LNA with EM guard rings on the chip were 616 and 617 represents inside and outside EM guard rings. 618, 619 and 620 represents quantized inductors respectively 7 nH, 21 nH and 1.4 nH. There one inductor section has the value of L=0.7 nH. 622 represents two parts of EM guard sections with two inductors-antenna each, tied to the ground. Inside of EM guard rings 621 are placed the active and passive components of LNA with symmetry and balancing considerations regarding to the noise and power dissipation.

Figure 7:
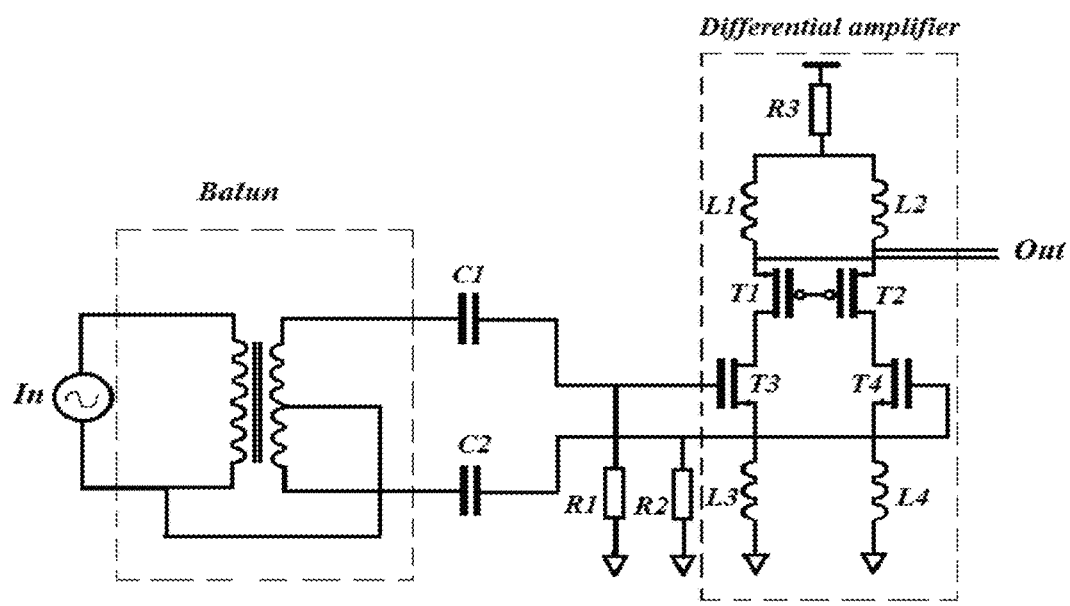
FIG. 7 illustrates the schematic of differential amplifier with balun.

FIG. 7 illustrates the schematic of differential amplifier with balun as an example for physical design implementation according to the present invention.

Figure 8:
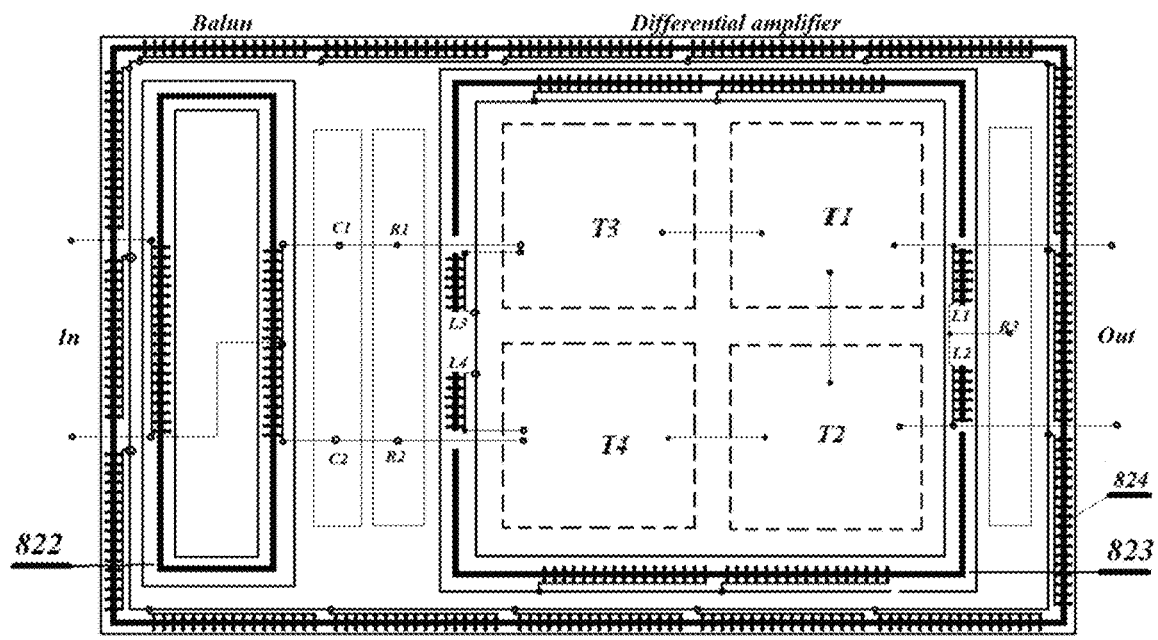
FIG. 8 illustrates the fourth preferred embodiment of the present invention, showing layout floor planning of differential amplifier with balun and protecting by EM guard rings on the chip.

FIG. 8 illustrates the fourth preferred embodiment of present invention, showing layout floor planning of differential amplifier with balun and separated EM guard rings 822, 823 and common guard ring 824 on the chip. In comparison with prior art showing in FIG. 12 floor planning takes less rooms, and current flow, symmetry, balancing and insulation are better.

Figure 9:
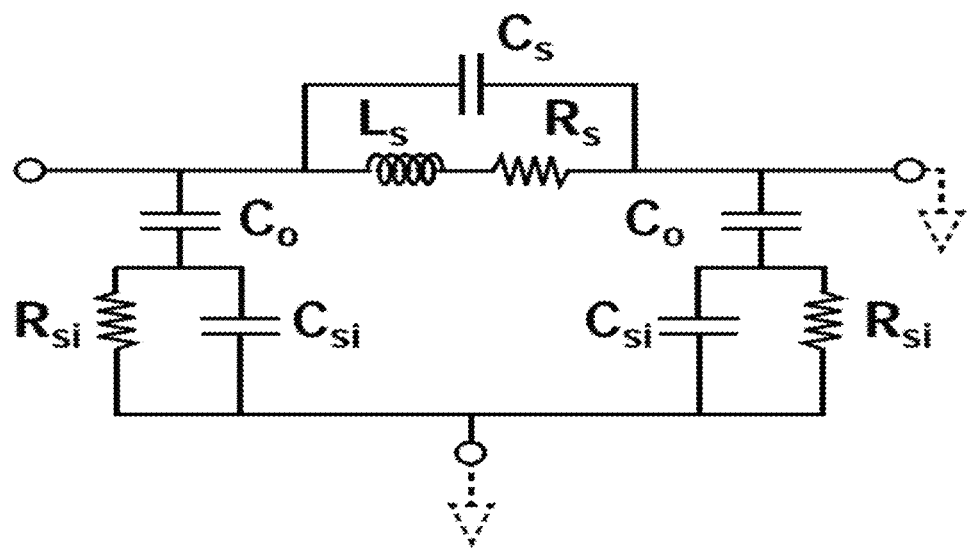
FIG. 9 illustrates the schematic model of on-chip resonator.

FIG. 9 illustrates the schematic model of on-chip resonator as an example for physical design implementation according to the present invention.

Figure 10:
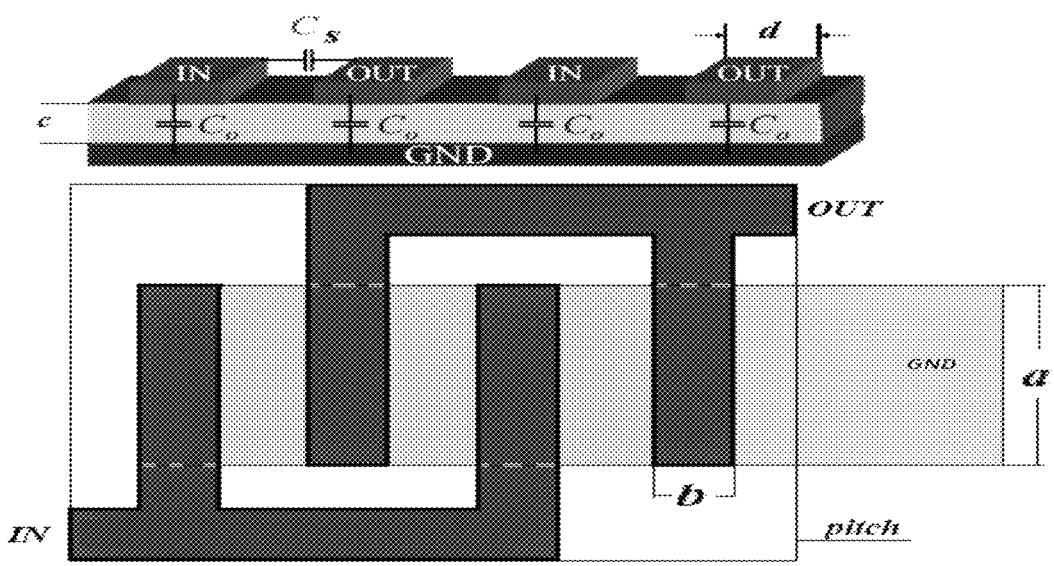
FIG. 10 illustrates layout floor planning of one capacitor section (pitch), which will be placed on the top of inductor section in quantized resonator.

FIG. 10 illustrates layout floor planning of one capacitor section (pitch), which will be placed on the top of inductor section in quantized resonator.

Figure 11:
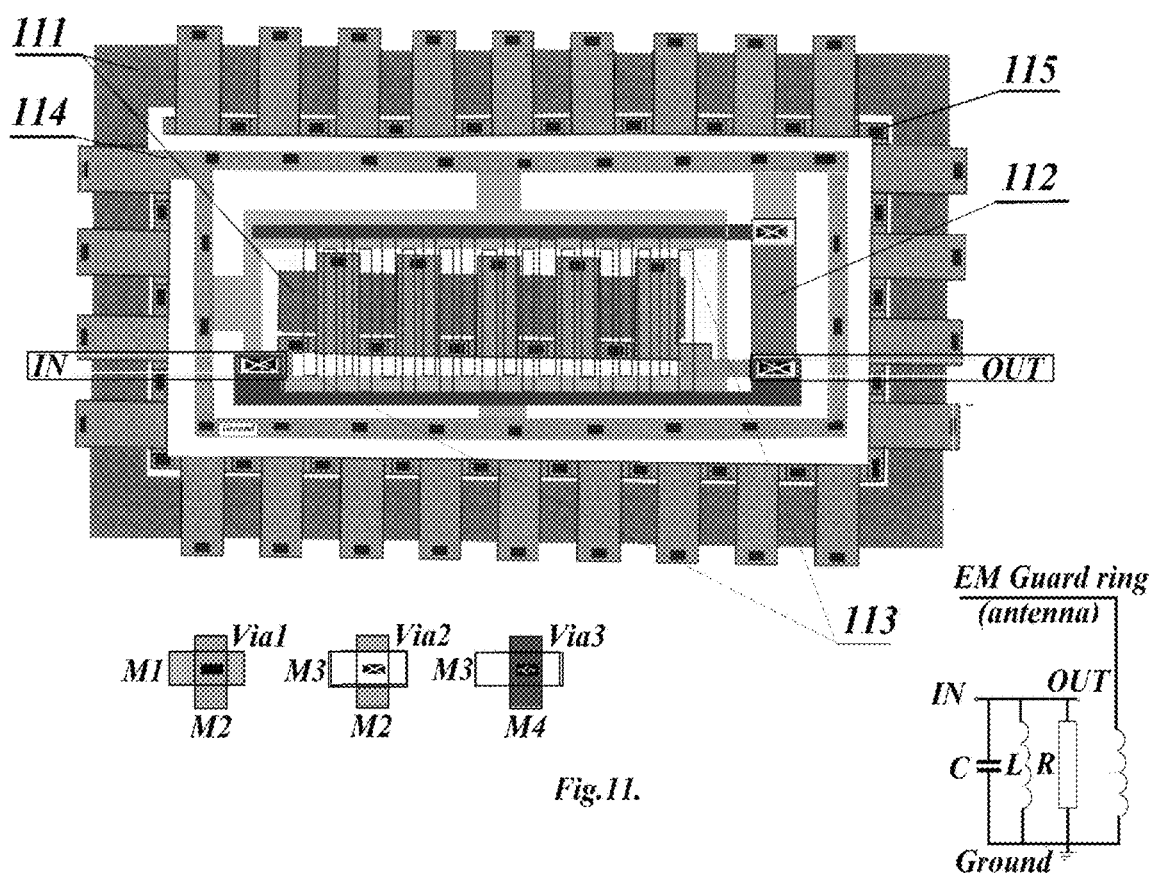
FIG. 11 illustrates the fifth preferred embodiment of the present invention, showing layout floor planning of the resonator with EM guard ring.

FIG. 11. illustrates the fifths preferred embodiment of present invention, showing layout floor planning of resonator with EM guard ring were 111 represent ferromagnetic core, 112—output resistor, parallel connected to the quantized capacitor, 113—shows two peripheral adjustable capacitor sections, 114 represent the metal ring connected to the ground and to the first node of guard ring quantized inductor, 115 represent the open second node of guard ring quantized inductor which serves as EM antenna.

Figure 12:
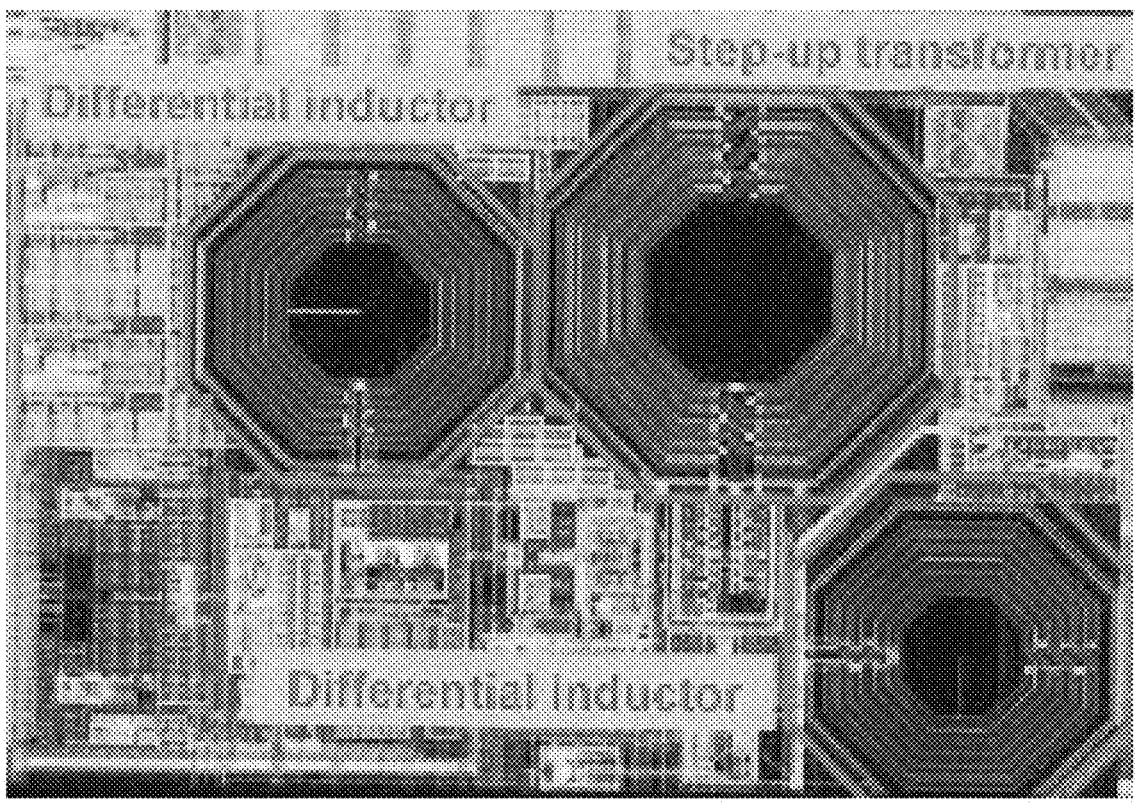
FIG. 12 illustrates an example of prior art, showing partial planar chip view of a differential amplifier with balun and inductors.

FIG. 12. Illustrates an example of prior art showing partial planar chip view of a differential amplifier with balun and inductors.

What is claimed is:

1. A chip with an on-chip quantized inductor comprising a plurality of inductor sections, an insulated ferromagnetic core, an electromagnetic (EN) guard ring, dummy inductors, and a metallic envelope, wherein each of the plurality inductor sections represents one turn and includes two patterned, insulated, and stacked metal layers with identical area and configuration, winding around the insulated ferromagnetic core, interconnected by a stacked via, and protected from EM impact by the EM guard ring and shielded by the metallic envelope.

2. A plurality of the on-chip quantized inductors of claim 1 as parts of an on-chip alternative current A( ) power transformer, having a primary winding and multiple secondary windings, comprising the common insulated ferromagnetic core, shielded by the metallic envelope, placed external to an active chip area between a seal ring and a pad-ring enhanced area, wherein the coupling coefficient can be adjusted by changing the number of the inductor sections during physical design, extraction netlist from a layout view, and simulation of the AC power transformer.

3. The on-chip quantized inductor of claim 1, as part of a functional cell, wherein the functional cell is placed inside of an active chip area in proximity to related sensitive linear active and passive components and along with sensitive inductors, separated by the dummy inductors, further wherein the functional cell comprising the insulated ferromagnetic core, the EM guard ring and the common metallic envelope, further wherein the inductance of the sensitive inductors can be adjusted by changing the number of inductor sections during physical design, after extraction netlist from layout view, and stimulation of the functional cell.

4. The on-chip quantized inductor of claim 1, wherein a first node of the quantized inductor is open and a second node is tied to the ground and serves as an EM antenna.

5. The on-chip quantized inductor of claim 1 as part of an on-chip resonator comprising a resistor, and parallel connected metal-oxide-metal (MON) capacitor sections, each of the parallel connected MOM capacitor sections being placed on the tops of each of the inductor sections, wherein a total capacitance value can be adjusted during physical design, extraction net list from a layout view, and simulation of the on-chip resonator in order to achieve the best Q-factor.

6. The on-chip quantized inductor of claim 1, wherein the ferromagnetic core comprises at least one insulated and shielded ferromagnetic layer, the at least one insulated and shielded ferromagnetic layer being fabricated using at least one of CMOS, BICMOS, BCD, MEMS and FINFET technologies with additional lithography processing and thin film physical vapor deposition including one or more of the following ferromagnetic materials: Fe20, FeOIFe2O3, NiOexO3 and CuOFe2O1.

7. The on-chip quantized inductor of claim 1, placed inside of an on-chip balanced-to-unbalanced device (balun) in proximity to related sensitive components, further wherein the balun comprising a primary winding and a secondary winding, protected from internal and external EM impact by the EM guard rings and the common metallic envelope.

8. The on-chip quantized inductor of claim 1, wherein the metallic envelope comprises a bottom horizontal metal layer, a top horizontal metal layer and a lateral vertical metallic layer, further wherein the lateral vertical metallic layer is formed from horizontally and vertically stacked vias; the bottom horizontal metal layer, the top horizontal metal layer, and the lateral vertical metallic layer are lithography formed using multiple consecutive vertical deposited metals, the horizontally and vertically stacked vias and multiple horizontally and vertically stacked silicone dioxide layers are fabricated during conventional integrated circuit processing.

* * * * *